United States Patent
Melcher et al.

(10) Patent No.: US 9,502,634 B2
(45) Date of Patent: Nov. 22, 2016

(54) PIEZOELECTRIC COMPONENT AND METHOD FOR PRODUCING A PIEZOELECTRIC COMPONENT

(71) Applicant: Robert Bosch GmbH, Stuttgart (DE)

(72) Inventors: Reinhold Melcher, Erlangen (DE); Michael Guenther, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 286 days.

(21) Appl. No.: 14/151,961

(22) Filed: Jan. 10, 2014

(65) Prior Publication Data

US 2014/0191620 A1    Jul. 10, 2014

(30) Foreign Application Priority Data

Jan. 10, 2013   (DE) .................. 10 2013 200 242

(51) Int. Cl.
*H01L 41/047* (2006.01)
*H01L 41/293* (2013.01)
*H01L 41/113* (2006.01)
*H01L 41/313* (2013.01)

(52) U.S. Cl.
CPC ....... *H01L 41/0477* (2013.01); *H01L 41/0472* (2013.01); *H01L 41/0475* (2013.01); *H01L 41/1132* (2013.01); *H01L 41/293* (2013.01); *H01L 41/313* (2013.01); *Y10T 29/42* (2015.01)

(58) Field of Classification Search
CPC ................. H01L 41/083; H01L 41/09; G01L 23/10; G01L 1/16
USPC ......................... 310/328, 338, 364
See application file for complete search history.

(56) References Cited

U.S. PATENT DOCUMENTS

| | | | | |
|---|---|---|---|---|
| 4,833,659 A * | 5/1989 | Geil | ............... | B06B 1/0603 310/326 |
| 5,233,256 A * | 8/1993 | Hayashi | ............... | H01L 41/083 310/317 |
| 6,091,182 A * | 7/2000 | Takeuchi | ............... | G02B 26/08 310/324 |
| 2001/0009344 A1* | 7/2001 | Furukawa | ............. | H01L 41/0533 310/358 |
| 2002/0149296 A1* | 10/2002 | Fujii | .................. | B41J 2/14233 310/328 |

(Continued)

FOREIGN PATENT DOCUMENTS

DE   4212018   10/1992
DE   69605876   7/2000

(Continued)

*Primary Examiner* — Shawki S Ismail
*Assistant Examiner* — Bryan Gordon
(74) *Attorney, Agent, or Firm* — Michael Best & Friedrich LLP

(57) ABSTRACT

An electrically conductive contact layer (4) is provided with a joining material (9) during a method for producing a piezoelectric component (1), in particular a piezoelectric sensor (1). To this end, the electrically conductive contact layer (4) can be dipped into a paste that serves to form the joining material (9). The contact layer (4) provided with the joining material (9) is subsequently disposed between a first piezoceramic layer (2) and a second piezoceramic layer (3). The contact layer (4) is then inserted via the joining material (9) between the first piezoceramic layer (2) and the second piezoceramic layer (3), wherein a pressure is applied to the first piezocermaic layer (2) against the second piezoceramic layer (3).

10 Claims, 2 Drawing Sheets

(56) References Cited

U.S. PATENT DOCUMENTS

| | | | |
|---|---|---|---|
| 2003/0107867 A1 | 6/2003 | Iwase et al. | |
| 2008/0199332 A1 | 8/2008 | Satoh et al. | |
| 2010/0140379 A1* | 6/2010 | Suzuki | H01L 41/273 239/569 |
| 2011/0266922 A1* | 11/2011 | Uetani | H01L 41/0533 310/328 |

FOREIGN PATENT DOCUMENTS

| | | |
|---|---|---|
| DE | 102007018007 | 10/2008 |
| DE | 102008027999 | 12/2008 |
| DE | 102009000192 | 7/2010 |
| DE | 102010000827 | 7/2011 |
| EP | 1054459 | 11/2000 |
| JP | 2008172106 | 7/2008 |
| WO | 2007138346 | 12/2007 |

* cited by examiner

PIEZOELECTRIC COMPONENT AND METHOD FOR PRODUCING A PIEZOELECTRIC COMPONENT

BACKGROUND OF THE INVENTION

The invention relates to a piezoelectric component, in particular a piezoelectric sensor, as well as to a method for producing such a piezoelectric component. The invention relates specifically to the area of piezoceramic pressure sensors which are used for measuring pressure in motor vehicles.

The German patent publication DE 10 2010 000 827 A1 discloses a fuel injector having a force or pressure sensor. In the case of said disclosed fuel injector, the force or pressure sensor is associated with a control chamber, the pressure of which determines the strokes or positions of a nozzle needle. The profile of the control chamber pressure can be acquired using the force or pressure sensor.

When designing a piezoelectric pressure sensor, it is conceivable that ceramic layers and electrode layers disposed between said ceramic layers are provided, wherein, in order to contact an electrode layer, the associated ceramic layer has a recess at this location. The contacting can then take place by soldering. In so doing, two ceramic layers of different size can also be provided in order to allow access to the electrode layer. The contact to an electric circuit can, for example, be produced by means of adhesive bonding, welding or clamping. These embodiments have the disadvantage that the effective cross sectional area for signal generation is reduced with respect to the required installation space. This negatively impacts the sensor signal. In addition, an additional space for contacting is required for the connection. In particular with regard to a clamping connection, a space for the clamping partner has to be provided.

Furthermore, the problem arises in particular in applications like when measuring the pressure in fuel injectors that a high pressure resistance has to be ensured.

The German patent publication DE 10 2009 000 192 A1 discloses a sintered material in which metallic and/or ceramic auxiliary particles which do not outgas in the course of the sintering process are provided. The auxiliary particles can thereby serve as spacers for defining a layer thickness.

SUMMARY OF THE INVENTION

The invention provides a piezoelectric component and a method for making the component, which has a first piezoceramic layer, at least one second piezoceramic layer and at least one electrically conductive contact layer which is disposed at least partially between the first piezoceramic layer and the second piezoceramic layer, wherein the contact layer is inserted via a joining material between the first piezoceramic layer and the second piezoceramic layer. The inventive piezoelectric component and the inventive method have the advantage that an improved design of the piezoelectric component and an improved functionality thereof are made possible. In particular, systematic signal deviations occurring over the service life of the piezoelectric component can be reduced.

It is advantageous that the contact layer is inserted via the joining material between the first piezoceramic layer and the second piezoceramic layer by pressure being applied to said first piezoceramic layer against said second piezoceramic layer. It is furthermore advantageous that the joining material is joined to the contact layer by sintering and/or that the joining material is joined to the first piezoceramic layer by sintering. A combination of a pressure application and a joining by means of simultaneous sintering is particularly advantageous. By impinging the joining material with pressure during production, changes to the joining material during operation are prevented. The pressure applied to the joining material can thereby be specifically matched to the pressure occurring during normal operation for the respective application. If, for example, exactly that pressure is applied to the joining material during production which also acts between the first piezoceramic layer and the second piezoceramic layer on the joining material in the case of normal operation, changes in the joining material at pressures and temperatures prevailing during operation are at least for the most part prevented. Systematic changes to properties of the piezoelectric component occurring over the service life thereof are thus prevented. Systematic signal changes are particularly prevented.

In an advantageous manner, the joining material is based on silver or a silver compound. In so doing, a silver sintering technology can particularly be used as the pressure loading process. The joining material can thereby be based on silver particles which, while avoiding a molten phase, form an electrical and mechanical contact during processing.

It is furthermore advantageous that the joining material is based on silver or a silver compound and/or a silver alloy, wherein the silver or the silver compound and/or the silver alloy is filled with a further material. As a result, suitable materials can, for example, be introduced as auxiliary materials into the base material consisting entirely or partially of silver in order to form the joining material.

The electrically conductive contact layer can thereby be advantageously formed by means of a metallic insert. The electrically conductive contact layer can therefore be formed in particular by a thin metal layer which has a high degree of conductivity and a homogeneous microstructure. As a result, an optimal signal generation is possible. In addition, the contact layer can thereby protrude out of the composite with the first piezoceramic and the second piexoceramic layer thereof. This facilitates an optimal decrease in the signal. In addition, the effective cross section for signal production can be optimized with regard to the required installation space. It is particularly advantageous that the first piezoceramic layer and the second piezoceramic layer are connected via the joining material to the contact layer inserted between the same such that said first and second piezoceramic layers have congruent connection cross-sectional surfaces. Recesses on one of the ceramic layers or layers of different size, which allow additional space to be exposed for contacting, are therefore not required.

By introducing the joining material, it is furthermore advantageous that tolerances, waviness or surface irregularities of the contact layer or of the ceramic layers can be compensated during production in a simple manner.

During production of the piezoelectric component, it is furthermore advantageous that the electrically conductive contact layer is dipped into a paste serving to form the joining material in order to provide the electrically conductive contact layer with the joining material. In the process, the quantity of the joining material adhering to the contact layer can among other things be adjusted by means of the viscosity of the paste. In particular, the quantity of the joining material can thereby be reduced to the required minimum value; thus enabling the distance between the piezoceramic layers to be reduced on the one hand which favorably impacts signal generation and a material consumption, in particular the required quantity of silver, to be reduced on the other hand.

BRIEF DESCRIPTION OF THE DRAWINGS

Preferred exemplary embodiments of the invention are explained in detail in the following description with reference to the attached drawings, in which corresponding elements are provided with coinciding reference numerals. In the drawings.

DETAILED DESCRIPTION

Figure 1:
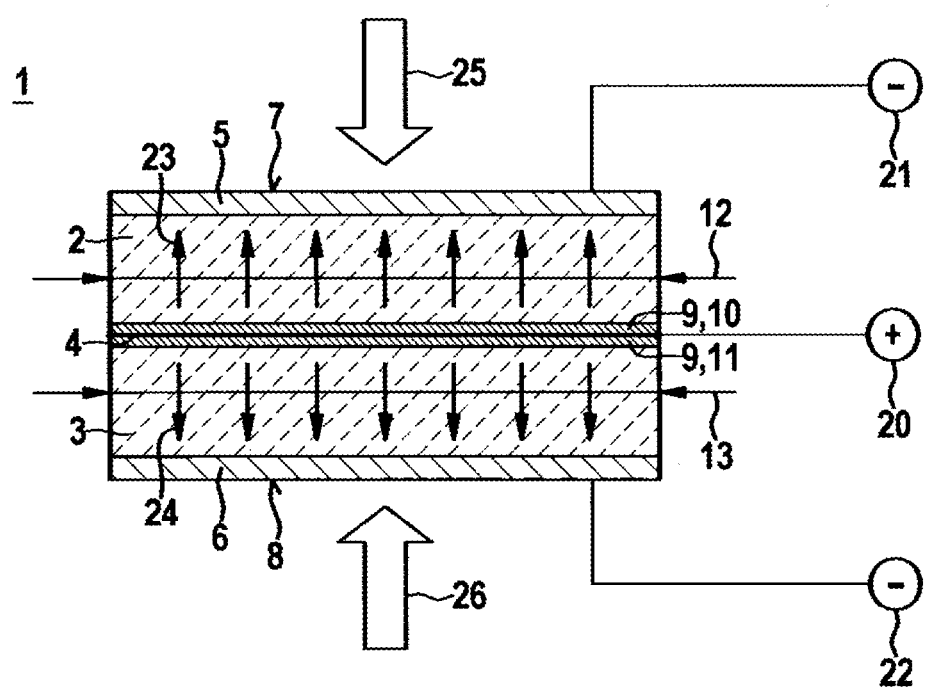
FIG. 1 shows as piezoelectric component corresponding to a first exemplary embodiment of the invention in a schematic sectional representation.

FIG. 1 shows a piezoelectric component 1 corresponding to a first exemplary embodiment and shown in a schematic sectional representation. The piezoelectric component 1 preferably serves as a piezoelectric sensor 1. The piezoelectric sensor 1 can particularly be used in fuel injection systems. The piezoelectric sensor 1 can, for example, serve as a needle closing sensor which monitors a closing of a valve needle of a fuel injection valve. At the same time, the sensor 1 can also measure a pressure profile within a fuel chamber of the fuel injection valve. The sensor 1 can also be designed as a combustion chamber pressure sensor 1 which directly or indirectly measures the pressure in a combustion chamber of an internal combustion engine. The piezoelectric sensor 1 is however also suited to other applications, in particular in the automotive field. The sensor 1 can also be specifically used as an operating means sensor for hydraulic or pneumatic applications The piezoelectric sensor 1 has a first piezoceramic layer 2 and a second piezoceramic layer 3. The piezoelectric sensor 1 furthermore comprises an electrically conductive contact layer 4 which is disposed between the first piezoceramic layer 2 and the second piezoceramic layer 3. In this exemplary embodiment, electrically conductive contact layers 5, 6, which form the outsides 7, 8 of the sensor 1, are furthermore applied to the piezoceramic layers 2, 3.

A design comprising two piezoceramic layers 2, 3 is thus realized in this exemplary embodiment. In a modified embodiment, more than two piezoceramic layers 2, 3 can however be provided.

The contact layer 4 is inserted via a joining material 9 between the first piezoceramic layer 2 and the second piezoceramic layer 3. A first portion 10 of the joining material 9 is thereby situated between the contact layer 4 and the first piezoceramic layer 2. A second portion 11 of the joining material 9 is then situated between the contact layer 4 and the second piezoceramic layer 3. The contact layer 4 is connected to the adjacent piezoceramic layers 2, 3 by means of the joining material 9. The joining material also serves in this case to compensate for tolerances, waviness, irregularities and the like which can occur on the contact layer 4 or on the piezoceramic layers 2, 3. The portions 10, 11 of the joining material 9 can merge into each other in individual regions, in particular in peripheral regions. This is, for example, conceivable in a case in which the contact layer 4 does not extend over an entire cross section 12 of the first piezoceramic layer 2 or a cross section 13 of the second piezoceramic layer 3 so that peripheral regions between the piezoceramic layers 2, 3 are filled by the joining material 9.

The contact layer 4 is connected to a pole 20 which serves as a plus pole for the measuring signal in this exemplary embodiment. The contact layer 5 is connected to a pole 21 which serves as a minus pole. The contact layer 6 is connected to a pole 22 which likewise serves as a minus pole. The piezoceramic layers 2, 3 are in this sense homopolarly oriented so that the poles 21, 22 can be jointly connected to ground; thus enabling only one connection insulated from ground, in particular a connecting cable, to be required for tapping the measuring signal at the pole 20. The poles 21, 22 can be specifically connected to a housing. The polarization of the piezoceramic layers 2, 3 is illustrated by the arrows 23, 24, where only the arrows 23, 24 are indicated in order to simplify the depiction.

In operation, the first piezoceramic layer 2 is impinged with a force 25 against the second piezoceramic layer 3, wherein a supporting force 26 results which is identically large in amount but directed oppositely to said force 25. The force 25 and the supporting force 26 lead to pressure being applied to the piezoceramic layers 2, 3; thus enabling the measuring signal to be generated by means of the piezoelectric effect. In this case, the joining material 9 is furthermore impinged with pressure.

During production of the sensor 1, the insertion of the contact layer 4 between the piezoceramic layers 2, 3 takes place via the joining material 9 when pressure is applied. The amount of pressure being applied can be selected here such that the pressure corresponds to the pressures acting during operation by means of the force 25. At the temperatures and pressures prevailing during operation, no significant change in the material structure then occurs, and therefore no changes in the material properties of the joining material 9 occur. The contact layer 4 is preferably formed by means of a metallic insert which is therefore pressure resistant.

The joining material 9 can be based on silver or a silver compound.

In this exemplary embodiment, the first piezoceramic layer 2 and the second piezoceramic layer 3 are connected via the joining material 9 to the contact layer 4 inserted between the same such that said first and second piezoceramic layers have at least approximately congruent connection cross-sectional surfaces, which are equal to the cross sections 12, 13 of the piezoceramic layers 2, 3. The piezoceramic layers 2, 3 can thus be embodied with congruent cross sections 12, 13.

Figure 2:
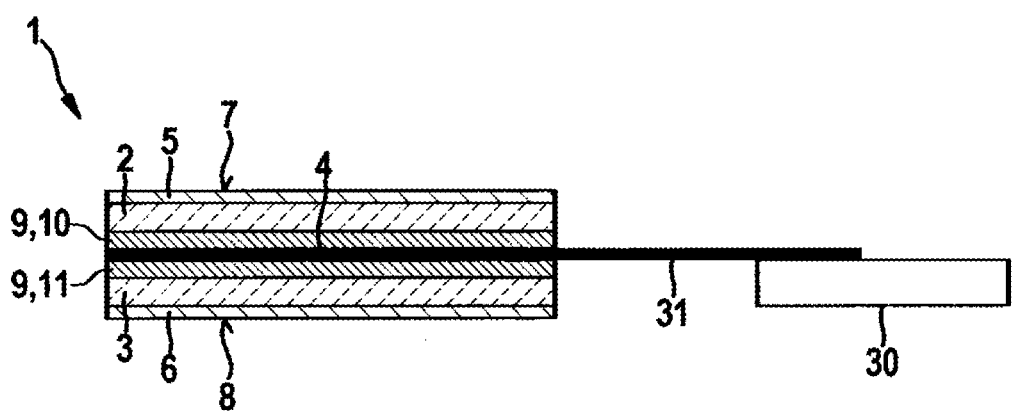
FIG. 2 shows a piezoelectric component corresponding to a second exemplary embodiment of the invention and having a contact partner in a schematic sectional representation.

FIG. 2 shows a piezoelectric component 1, in particular a piezoelectric sensor 1, corresponding to a second exemplary embodiment with a contact partner 30 in a schematic sectional representation. In this exemplary embodiment, the contact layer 4 protrudes out of the composite comprising the first piezoceramic layer 2 and the second piezoceramic layer 3. As a result, a contacting extension 31 is formed which facilitates a simple contacting to the contact partner 30. Depending on the embodiment of the contact layer 4, a shaping, in particular bending, of the contacting extension 31 is also possible. In addition, the contacting extension 31 can be suitably configured already prior to introducing the contact layer 4 into the composite. For example, a flap-shaped or pin-shaped configuration of the contacting extension 31 is possible.

A design of the sensor 1 is thus possible in which the external contacting during production is realized simultaneously via the contacting extension 31 and via the contact layers 5, 6 which form the outer sides 7, 8 of the sensor 1. The sensor 1 is furthermore stable with respect to the operating conditions as a result of the pressure applied during production.

The connection of the contacting extension 31 to the contact partner 30 can furthermore be designed with a certain amount of spacing in the composite comprising the piezoceramic layers 2, 3 and the joining material 2, 3 so that damage, in particular thermal damage, is prevented.

Figure 3:
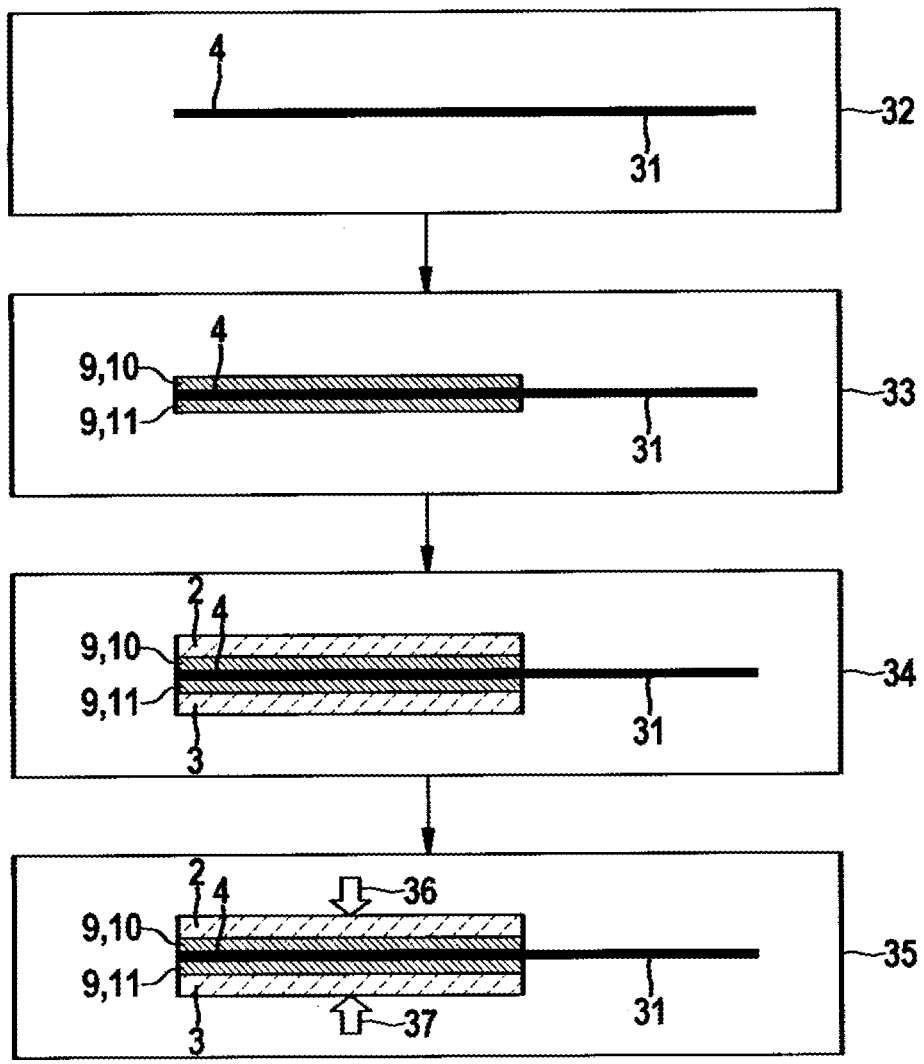
FIG. 3 shows a process flow diagram for explaining a method for producing the piezoelectric component corresponding to the second exemplary embodiment which is depicted in FIG. 2.

FIG. 3 depicts a process flow diagram for the purpose of explaining a method for producing the piezoelectric component 1 depicted in FIG. 2 in accordance with the second exemplary embodiment. In order to explain the method, the process flow diagram depicts consecutive steps 32 to 35 during production. In this connection, further steps can also be provided. In particular, further intermediate steps are also possible.

In step 32, the contact surface 4 is suitably prefabricated. In so doing, a suitable blank can be provided. In particular, the outer contour of the contact layer 4 can be defined by means of stamping.

In step 33 which follows step 32, the contact layer 4 is partially dipped into a paste for the joining material 9. In the process, the contacting extension 31 is not dipped into the paste. As a result, the contacting extension 31 remains exposed.

In step 34 which follows step 33, the contact layer 4 comprising the joining material 9 is disposed between the piezoceramic layers 2, 3. The joining material 9 thereby fills the space between the contact layer 4 and the adjacent piezoceramic layers 2, 3. Because the contact layer 4 is formed from a metallic material, a certain plastic deformation of the contact layer 4 is possible. This facilitates a certain tolerance compensation. In addition, the joining material 9 which is still paste like in step 34 adapts to the adjacent piezoceramic layers 2, 3 as well as to the contact layer 4.

Because the piezoceramic layers 2, 3 are generally fragile, the susceptibility to breakage during production and operation can thereby be reduced. In this connection, a postprocessing of the piezoceramic layers 2, 3, in particular a grinding or polishing, may not be necessary if a sufficient tolerance compensation is already provided by the contact layer 4 that has been furnished with the joining material 9.

The thickness of the electrically conductive composite consisting of the contact layer 4 and the joining material 9 can be adjusted by means of the contact layer 4, which can be formed from a cost effective metallic material. The amount of the joining material 9, which is preferably formed from silver, can thus be reduced to the required minimum. The amount of the joining material 9 can be kept small because the contact layer 4 also facilitates a tolerance compensation, in particular by means of plastic deformation.

In step 35 which follows step 34, a sintering takes place, wherein the first piezoceramic layer 2 is simultaneously impinged with pressure against the second piezoceramic layer 3. The impingement using such a pressure is illustrated in FIG. 3 by forces 36, 37, which are directed opposite to one another. By means of this process step in which said first piezoceramic layer is impinged with pressure against second piezoceramic layer, an electrical and mechanical contact with the contact layer 4 as well as a mechanical contact with the piezoceramic layers 2, 3 is formed from the silver particles of the paste for the joining material 9 while avoiding the molten phase. The resulting material structure of the joining material 9 is thereby influenced by the applied pressure. A difference particularly results with respect to a sintering without the application of pressure. For that reason, the piezoelectric sensor 1 is characterized by predetermined properties which do not change during operation at high pressures or at least are only subject to a reduced change.

The application and dosing of the joining material 9 can furthermore be simplified by configuring the electrically conductive contact layer 4 in the form of a planar intermediate contact. For this purpose, the contact layer 4 must only be dipped into the paste for the joining material 9 and then laid onto the piezoceramic layer 3. The piezoceramic layer 2 can subsequently be applied. Screen printing steps or the like for applying the joining material 9 are therefore not required.

Other options for applying the joining material 9 are however also conceivable. The pressure assisted temperature process, in particular the sintering of the joining material 9, can then follow in an unchanged manner.

After step 35, the contact layers 5, 6 can be applied to the piezoceramic layers 2, 3. This is, for example, possible by metalizing the piezoceramic layers 2, 3.

The invention is not limited to the exemplary embodiments described above.

What is claimed is:

1. A method for producing a piezoelectric component (1), comprising providing an electrically conductive contact layer (4) at least partially with a joining material (9), disposing the contact layer (4) provided with the joining material (9) at least partially between a first piezoceramic layer and a second piezoceramic layer (3), and inserting the contact layer (4) via the joining material (9) between the first piezoceramic layer (2) and the second piezoceramic layer (3) with a combination of simultaneously sintering and applying pressure to the first piezoceramic layer (2) against the second piezoceramic layer (3).

2. The method according to claim 1, characterized in that the electrically conductive contact layer (4) is dipped at least partially into a paste that serves to form the joining material (9) in order to provide the electrically conductive contact layer (4) with the joining material (9).

3. The method according to claim 1, characterized in that the joining material (9) is based on at least one of silver, a silver compound and a silver alloy, wherein the silver or, respectively, the silver compound and/or the silver alloy is filled with a further material.

4. The method according to claim 1, characterized in that that the joining material (9) is connected to the first piezoceramic layer (2) and the second piezoceramic layer (3) by means of sintering.

5. The method according to claim 4, characterized in that the joining material (9) is connected to the contact layer (4) by means of sintering.

6. The method according to claim 1, characterized in that the joining material (9) is based on silver or a silver compound.

7. The method according to claim 1, characterized in that the joining material (9) is connected to the contact layer (4) by means of sintering.

8. The method according to claim 1, characterized in that the contact layer (4) protrudes out of the composite comprising the first piezoceramic layer (2) and the second piezoceramic layer (3).

9. The method according to claim 1, characterized in that the electrically conductive contact layer (4) is formed by a metallic insert (4).

10. The method according to claim 1, characterized in that the first piezoceramic layer (2) and the second piezoceramic layer (3) are connected via the joining material to the contact layer (4) inserted between the same such that said first piezoceramic layer and said second piezoceramic layer have at least approximately congruent connection cross-sectional surfaces.

* * * * *